United States Patent [19]
Kurimoto et al.

[11] Patent Number: 5,221,632
[45] Date of Patent: Jun. 22, 1993

[54] METHOD OF PROUDCING A MIS TRANSISTOR

[75] Inventors: Kazumi Kurimoto; Akira Hiroki, both of Osaka; Shinji Odanaka, Hirakata, all of Japan

[73] Assignee: Matsushita Electric Industrial Co., Ltd., Osaka, Japan

[21] Appl. No.: 780,760

[22] Filed: Oct. 25, 1991

[30] Foreign Application Priority Data

Oct. 31, 1990 [JP] Japan .................. 2-295774

[51] Int. Cl.[5] ................................ H01L 21/265
[52] U.S. Cl. ........................ 437/44; 437/233; 437/241; 437/238; 437/50; 437/919
[58] Field of Search ............... 437/44, 43, 42, 41, 437/40, 233, 241, 913, 57, 58, 59; 148/DIG. 53

[56] References Cited

U.S. PATENT DOCUMENTS

| | | | |
|---|---|---|---|
| 4,545,114 | 10/1985 | Ito et al. | 437/59 |
| 4,808,548 | 2/1989 | Thomas et al. | 437/44 |
| 4,818,334 | 4/1989 | Shwartzman et al. | 437/233 |
| 4,994,404 | 2/1991 | Sheng et al. | 437/41 |
| 5,013,675 | 5/1991 | Shen et al. | 437/57 |
| 5,073,514 | 12/1991 | Ito et al. | 437/41 |

FOREIGN PATENT DOCUMENTS

| | | | |
|---|---|---|---|
| 0206160 | 12/1983 | Japan | 437/913 |
| 0175455 | 9/1985 | Japan | 437/913 |
| 0011260 | 1/1987 | Japan | 437/40 |
| 0070458 | 3/1988 | Japan | 437/44 |
| 0181378 | 7/1988 | Japan | 437/44 |
| 0308963 | 12/1988 | Japan | 437/41 |
| 0042843 | 2/1991 | Japan | 437/41 |

Primary Examiner—Brian E. Hearn
Assistant Examiner—Michael Trinh
Attorney, Agent, or Firm—Stevens, Davis, Miller & Mosher

[57] ABSTRACT

A MIS transistor, has a semiconductor substrate of a first conduction type; a gate insulation film and a gate electrode which are selectively formed on the semiconductor substrate; an insulating film formed on the side surface of the gate electrode and on the semiconductor substrate; a first gate side wall layer provided on the upper surface and side surface of the insulating film and having a dielectric constant greater than that of the insulating film, the first gate side wall layer having a height smaller than that of the gate electrode; and a second gate side wall layer composed of an insulating film which covers the first gate side wall layer. This MIS transistor can be produced by a known LSI production technique employing self-alignment, without increasing the number of the steps of the process.

3 Claims, 8 Drawing Sheets

METHOD OF PRODUCING A MIS TRANSISTOR

BACKGROUND OF THE INVENTION

1. Field of the Invention

The present invention broadly relates to VLSIs and, more particularly, to a MIS transistor, as well as to a method of producing the same.

2. Description of the Related Art

In general, a very large scale integrated circuit (VLSI) incorporates many very small MIS transistors. As a consequence, hot-electron degradation of a device under application of a high level of electrical field and parasitic capacitance have become a matter of great concern. In addition, the formation of very-small transistors require a production process which employs self-aligning technique. A MOS transistor, as an example of the conventional MIS transistors, is disclosed in IEEE ELECTRON DEVICE LETTERS Vol. 11, No. 2, 1990, p78–81. FIG. 2 is a cross-sectional view of this MOS transistor.

Referring to FIG. 2 which is a sectional view, the MOS transistor has a P-type semiconductor substrate 21, a gate oxide film 22 formed on the P-type semiconductor substrate 21, an N-type polysilicon gate electrode 23 formed on the gate oxide film 22, a thin oxide film 24 which is formed on the device region so as to cover the N-type polysilicon gate electrode 23, a polysilicon gate side wall 25 formed on the thin oxide film 24, an N-type low-density diffusion layer 26 formed on the p-type semiconductor substrate 21, and an N-type high-density diffusion layer 27 formed on the P-type semiconductor substrate 21. Numeral 28 denotes a passivation film on the device, while 29 designates a wiring laid on the passivation film 28.

In the MOS transistor having the described construction, when a voltage is applied to the N-type polysilicon gate electrode 23, current flows between the source and the drain of the N-type high-density diffusion layer 27, so that an electric field of a high level around the drain is reduced by the polysilicon gate sidewall 25, which has a high dielectric constant, e.g., 3 times as large that of the silicon oxide film which is an ordinary gate side wall, whereby hot-electron degradation is suppressed. Conversely, when no voltage is applied to the N-type polysilicon gate electrode 23, no current flows between the source and the drain of the N-type high-density diffusion layer 27, so that the MOS transistor functions as a switch.

The above-described MIS transistor encounters with the following problems due to the use of the conductive polysilicon gate side wall 25. When the electrical contact is to be attained in a self-aligning manner, a short-circuit is caused between the polysilicon gate side wall 25 and the wiring 29 laid on the side wall 25. The production of this MIS transistor, therefore, requires series of steps including, after the formation of the polysilicon gate side wall 25, depositing the passivation film 28 on the sidewall 25, and forming a contact hole by masking for attaining an electrical contact between the N-type high-density diffusion layer 27 and the wiring 29.

Another problem resides in that the material of the conductive polysilicon gate side wall 25 undesirably remains, without being etched, if any height difference in the device region, e.g., a recess formed between adjacent devices, causes an error in the wiring. In order to avoid such a wiring error or short-circuit mentioned before, it is necessary to lay the passivation film 28 thereover as shown in FIG. 2, which is quite inconvenient from the view point of the production of very large scale integrated circuit incorporating very small transistors.

Furthermore, the use of the polysilicon gate side wall 25 having a high dielectric constant increases the parasitic capacitance C between the wiring 29 laid above the gate and the polysilicon gate electrode 23, which causes a retardation of the speed of switching of the MOS transistor.

SUMMARY OF THE INVENTION

Accordingly, an object of the present invention is to provide a MIS transistor which is suitable for production by a process employing self-aligning technique for attaining electrical contact and which allows the use of a conductive material as the material of a first gate side wall so as to suppress hot-electron degradation, the MIS transistor also exhibiting a reduced parasitic capacitance between the wiring laid above the gate and the gate electrode.

Another object of the present invention is to provide a method of producing this MIS transistor.

To this end, according to one aspect of the present invention, there is provided a MIS transistor, comprising: a semiconductor substrate of a first conduction type; a gate insulation film and a gate electrode which are selectively formed on the semiconductor substrate; an insulating film formed on a side surface of the gate electrode and on the semiconductor substrate; a first gate side wall layer provided on an upper surface and side surface of the insulating film and having a dielectric constant greater than that of the insulating film, the first gate side wall layer having a height smaller than that of the gate electrode; and a second gate side wall layer composed of an insulating film which covers the first gate side wall layer.

According to another aspect of the present invention, there is provided a method of producing a MIS transistor, comprising the steps of: forming a gate insulation film on a major surface of a semiconductor substrate of a first conduction type; forming a gate electrode on the gate insulation film; depositing a first insulating film on the gate electrode and on the semiconductor substrate; depositing a first gate side wall layer having a higher dielectric constant than that of the first insulating film; effecting an etching process with a large vertical anisotropy so as to selectively etch the first gate side wall layer so as to allow a portion of the first gate side wall layer to remain, in a self-aligning manner, on a side of the gate electrode at a height smaller than that of the gate electrode; depositing a second insulating film on the semiconductor substrate; and effecting an etching process with a large vertical anisotropy so as to allow a portion of the second insulating film to cover the first gate side wall.

According to the present invention, an electric field of high intensity around the drain is reduced by virtue of the first gate side wall layer having high dielectric constant, so that hot-electron degradation is suppressed. In addition, the second gate side wall layer constituted by an insulating film separates the gate electrode and the high-density diffusion layer from each other, so that electrical contact can be attained by a self-aligning technique. In addition, parasitic capacitance between the wiring above the gate and the gate electrode can be reduced.

DESCRIPTION OF THE PREFERRED EMBODIMENTS

First Embodiment

Figure 1:
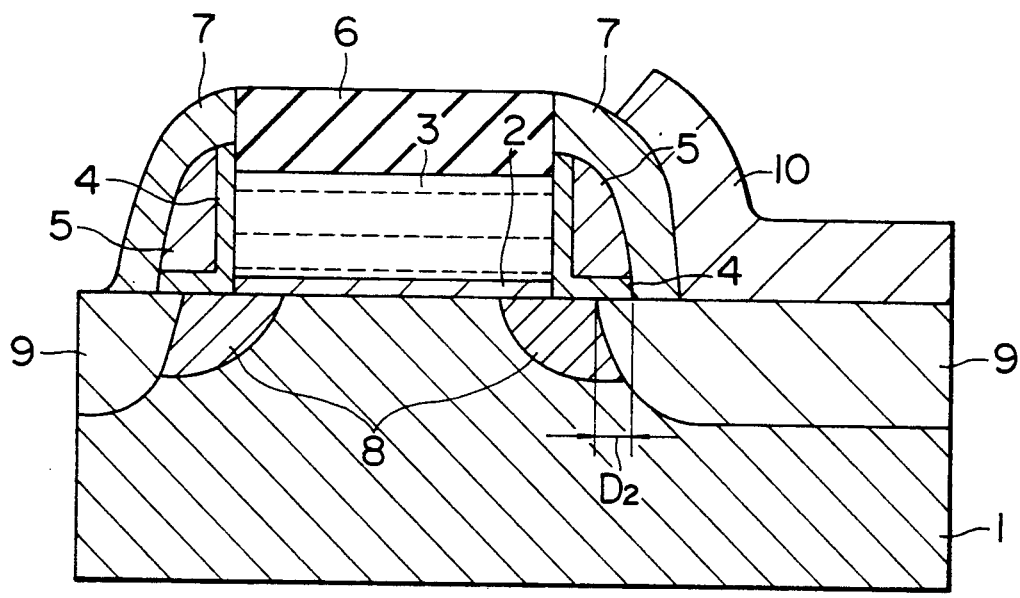
FIG. 1 is a sectional view of a first embodiment of a MIS transistor in accordance with the present invention.
Figure 2:
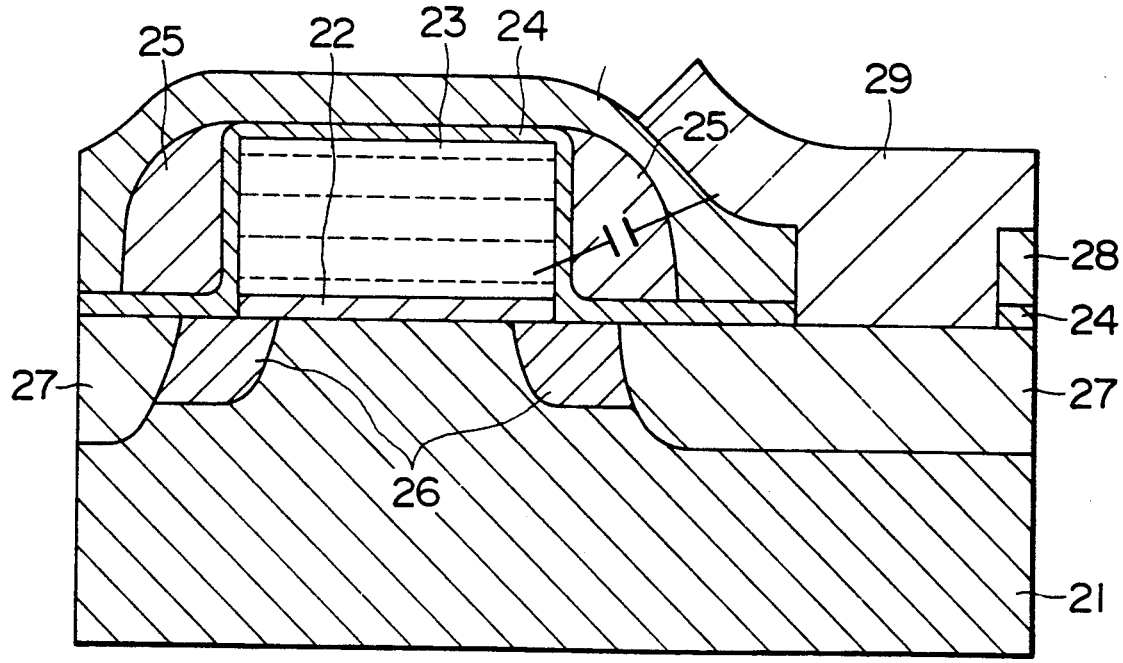
FIG. 2 is a sectional view of a conventional MIS transistor.

FIG. 1 is a sectional view of a first embodiment of a MIS transistor in accordance with the present invention. As illustrated, the MIS transistor has a P-type silicon substrate 1, a gate oxide film 2 on the P-type silicon substrate 1, a polysilicon gate electrode 3 on the gate oxide film 2, a thin oxide film 4 covering the side surfaces of the gate electrode 3 and adjacent portions of the silicon substrate 1, a first gate side wall 5 made of, e.g., polysilicon, formed on the thin oxide film 4, an insulating film 6 made of, e.g., an HTO film, formed on the gate electrode 3, a second gate side wall oxide film 7 made of, e.g., an HTO film, formed to cover the side wall 5 of the first gate, an N-type low-density diffusion layer 8 formed on the P-type semiconductor substrate 1, an N-type high-density diffusion layer 9 formed on the P-type semiconductor substrate, and an Al wiring layer 10.

This embodiment of the MIS transistor of the present invention is characterized in that a side wall formed on the side surfaces of the gate electrode 3 is composed of two layers: namely, the first gate side wall 5 made of a material having a high dielectric constant such as polysilicon and the second gate side wall 7. Another characteristic feature resides in that the first gate side wall made of the material having high dielectric constant is formed so as to cover the low-density diffusion layer. With this arrangement, hot-electron degradation of transistors is suppressed.

In operation, when a voltage is applied to the gate electrode 3, electrical current flows between the source and the drain of the N-type high-density diffusion layer 9. Since the first gate side wall 5 made of the material having a high dielectric constant such as polysilicon covers the N-type low-density diffusion layer 8 while partially overlapping the N-type high-density diffusion layer 9, the horizontal electric field around the drain is reduced so that the hot-electron degradation is suppressed. When no voltage is applied to the gate electrode 3, no electrical current flows between the source and the drain of the N-type high-density diffusion layer 9, so that the transistor functions as a switch.

According to this embodiment, is it possible to attain electrical contact between the source/drain of the N-type high-density diffusion layer 9 and the wiring 10 by a self-alignment offered by the second gate side wall oxide film 7 made of, e.g., HTO film, without the aid of any mask, as will be seen from FIG. 1.

In addition, parasitic capacitance formed between the gate electrode 3 and the wiring 10 laid above the gate electrode 3 can be reduced as compared with the known MIS transistors.

Figure 5A:
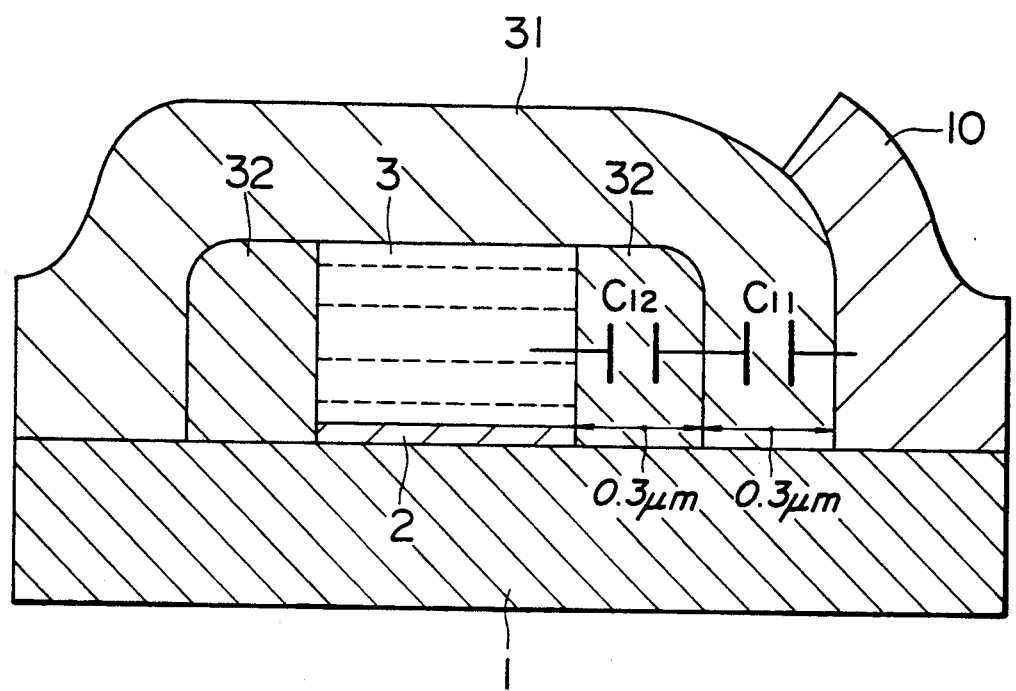
FIGS. 5a and 5b are schematic sectional views illustrating a MIS transistor of the present invention and a conventional MIS transistor, illustrative of the parasitic capacitance between the gate and the wiring on an assumption that they are parallel plates.

The principle of reduction in the parasitic capacitance will be described with specific reference to FIGS. 5a and 5b which show simple parallel flat plate capacitance models. The capacitance C per unit area is given by $C = \epsilon' \epsilon_0 / T_{ox}$ where, $\epsilon$ represents the dielectric constant in vacuum, $T_{ox}$ represents the film thickness and $\epsilon'$ represents the specific dielectric constant. It is assumed here that the thickness of the passivation film 31 ($SiO_2$) is 0.3 μm, while the thickness of the side wall 32 ($Ta_2O_5$) is 0.3 μm in the conventional structure in FIG. 5a. In such a case, the capacitance C11 per unit area of the side wall film 32 is given by $C11 = 3.9\epsilon_0/0.3 = 13\epsilon_0$. On the other hand, the capacitance C12 per unit area of the side wall film 32 is given by $C12 = 30\epsilon_0/0.3 = 100\epsilon_0$. The parasitic capacitance C10 per unit area between the gate electrode 3 and the wiring 10 is the capacitance of the series connection of the capacitances C11 and C12, and can be determined by $C10 = C11 \times C12/(C11+C12) = 11.5 \epsilon_0$.

Figure 5B:
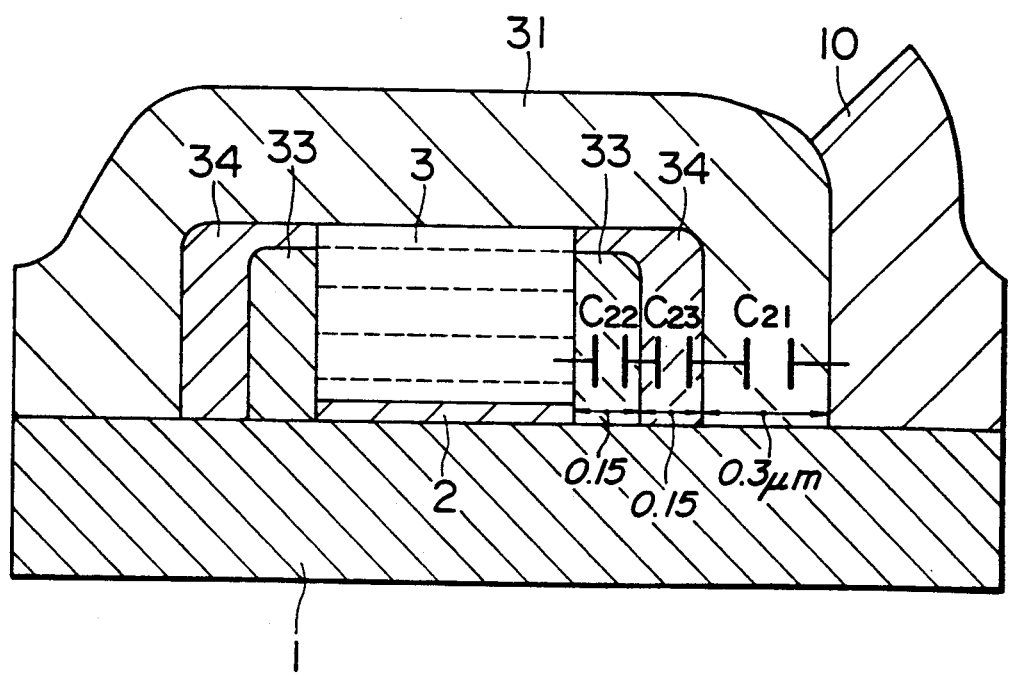

It is also assumed that, in the structure of the present invention shown in FIG. 5b, the thickness of the passivation film 31 ($SiO_2$) is 0.3 μm, the thickness of the first side wall film 33 ($Ta_2O_5$) is 0.15 μm and the thickness of the second side wall film 34 ($SiO_2$) is 0.15 μm. It is also assumed that the transistor shown in FIG. 5b is fabricated in the same manner as the conventional one shown in FIG. 5a. In such a case, the capacitance C21 per unit area of the passivation film 31 is expressed by $C21 = 13\epsilon_0$ which is the same as that in the conventional structure. The capacitance C22 per unit area of the first side wall film 33 is given by $C22 = 30\epsilon_0/0.15 = 200\epsilon_0$. The capacitance C23 per unit area of the second side wall film 34 is given by $C23 = 3.9\epsilon_0/0.15 = 26\epsilon_0$. The parasitic capacitance C20 between the gate electrode 3 and the wiring 10 is the capacitance of the series connection of the capacitances C21, C22 and C23 and, hence, is determined as $C20 = 8.3\epsilon_0$. It is thus understood that the present invention offers a reduction in the parasitic capacitance, and the ratio of the reduction is expressed by 8.3/11.5 = 72%.

In contrast to the prior art, in the production of the transistor of the present invention, the thin oxide film 4 and the gate oxide film 2 are prepared by different steps, so that the thicknesses of these films can be determined independently, which makes it possible to optimize the design factors such as the gate-drain dielectric strength and gate-drain parasitic capacitance taking into account of the hot-electron degradation.

Description will now be given of the first gate side wall. It is not always necessary that the first gate side wall 5 is positioned above the N-type high-density diffusion layer 9. Namely, the N-type diffusion layer 9 having a high density is not substantially influenced by the gate electrode 3 and, hence, is not changed into so as to be depleted, so that it is not always necessary that the first gate side wall 5 covers the N-type high density diffusion layer 9. Rather, the provision of the first gate side wall 5 in such a manner as to cover the N-type high-density diffusion layer 9 is not preferred because it increases the parasitic capacitances at the fringes.

Figure 6A:
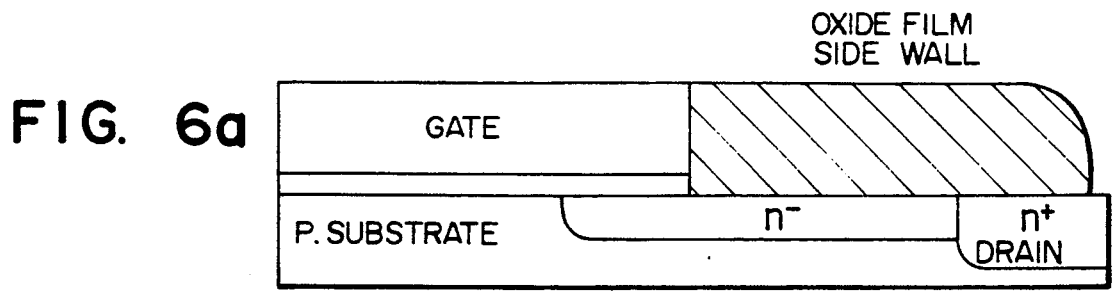
FIGS. 6a to 6c are schematic sectional views illustrating a conventional MIS transistor and a MIS transistor of the present invention.
Figure 6B:
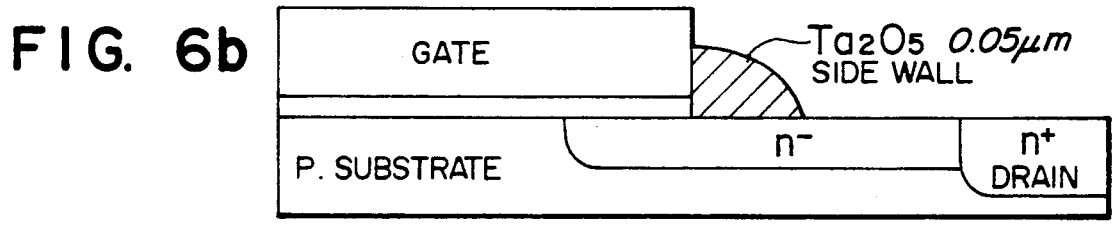
Figure 6C:
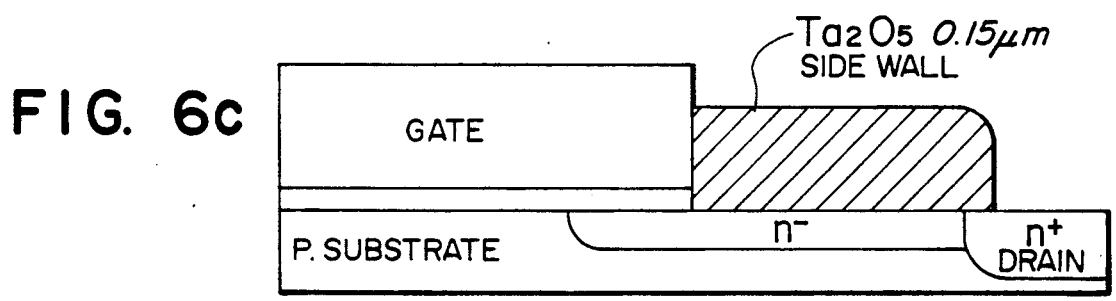
Figure 6D:
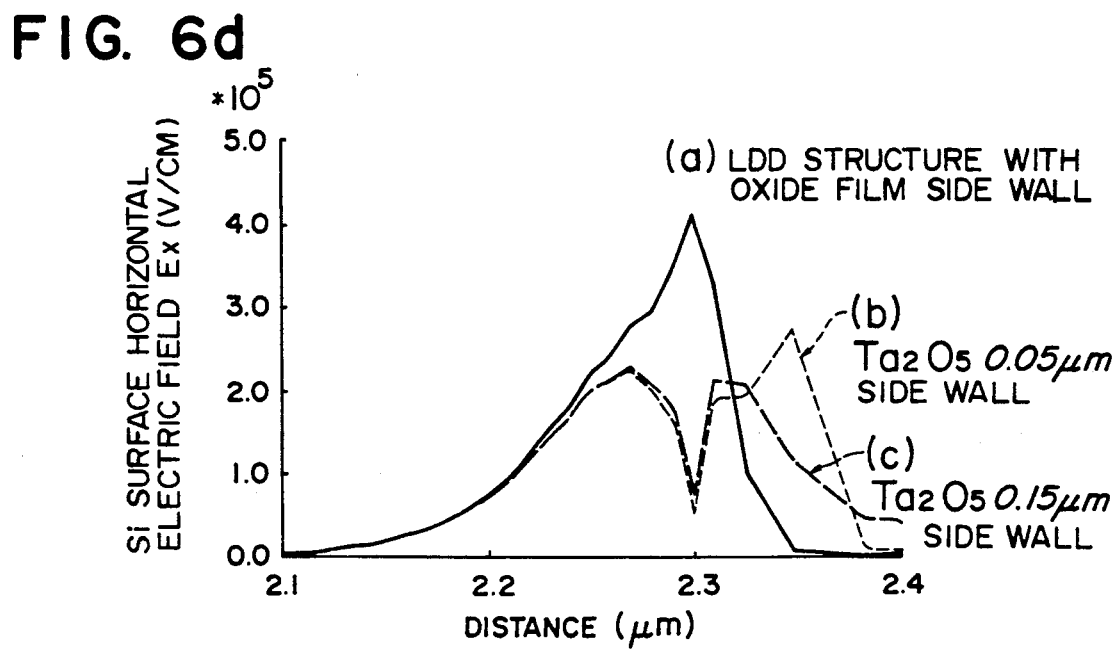
FIG. 6d is a chart illustrative of horizontal electric field at Si interface.

In contrast, it is necessary that the first gate side wall 5 is formed to cover the N-type low density diffusion layer 8, for a reason which will be described hereinunder with reference to FIGS. 6a to 6d. Referring to FIGS. 6a to 6c, an N-type low-density diffusion layer 8 and the N-type high-density diffusion layer 9 are formed on a P-type silicon substrate, and variation in the surface horizontal electric field Ex in the length of the side wall formed on a side of the gate electrode is given. FIG. 6d shows how the surface horizontal electric field Ex varies according to the length of the side wall.

More specifically, FIG. 6a shows a structure in which the side wall made of an oxide film extends to the region where the N-type high-density diffusion layer exists.

FIG. 6b shows a structure in which the $Ta_2O_5$ film as the first gate side wall extends to the intermediate portion of the N-type low-density diffusion layer.

FIG. 6c shows a structure in which the $Ta_2O_5$ film as the first gate side wall covers the N-type low-density diffusion layer and a portion of the N-type high-density diffusion layer.

The difference between the structure shown in FIG. 6a and the structure shown in FIG. 6c resides in that, while the former employs an oxide film ($SiO_2$) as the side wall, the latter employs a material having a high dielectric constant ($Ta_2O_5$) as the material of the side wall.

As will be seen from FIG. 6d, an electric field of a high intensity is developed at the end of the gate electrode shown in FIG. 6a, whereas, in the cases of the structures shown in FIGS. 6b and 6c, the horizontal electric field is appreciably reduced as compared with the structure of FIG. 6a, by virtue of the use of the $Ta_2O_5$ film having a high dielectric constant as the material of the side wall.

The reduction in the horizontal electric field, which is achieved by the use of the side wall ($Ta_2O_5$) having a high dielectric constant, serves to reduce the generation of hot electrons because electrons running in the channel direction are energized by the horizontal electric field. Consequently, the hot-electron degradation also is reduced in the transistor of the present invention.

The intensity of the electric field developed at the end of the side wall of $Ta_2O_5$ in the structure shown in FIG. 6b is greater than that in the structure shown in FIG. 6c. This suggests that the structure shown in FIG. 6c is preferably used. Namely, it is preferred that the first gate electrode made of a material having a high dielectric constant is formed to cover at least a part of the N-type low-density diffusion layer as shown in FIG. 6c or in FIG. 1.

Figure 7A:
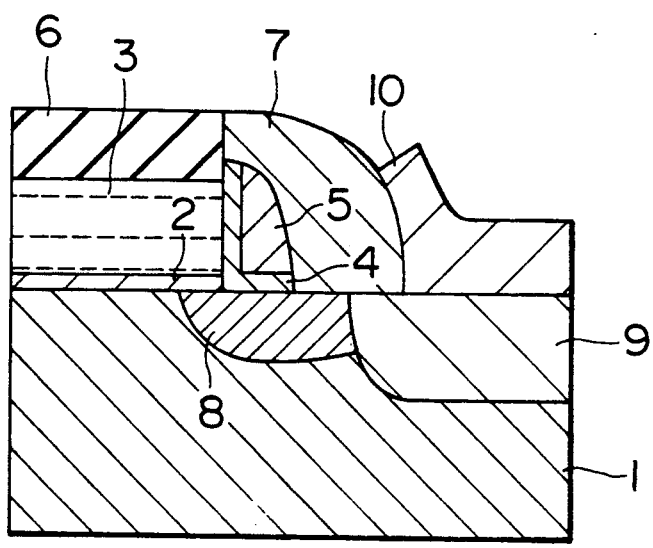
FIGS. 7a and 7b are sectional views illustrating different MIS transistors illustrative of a difference in the position of a high-density diffusion layer caused by a difference in the thickness of the second gate side wall.

This structure can be realized by controlling the position of the N-type high-density diffusion layer by adjusting the thickness of the second gate side wall, as will be described hereinunder with reference to FIGS. 7a and 7b. As will be understood from FIG. 7a, the end of the N-type high-density diffusion layer 9 is positioned beneath the second gate side wall 7 if the second gate side wall 7 has a large thickness. According to this arrangement, the first gate side wall 5 cannot fully cover the N-type low-density diffusion layer 8 so that an electric field of a large intensity is developed at the end of the first gate side wall 5.

Figure 7B:
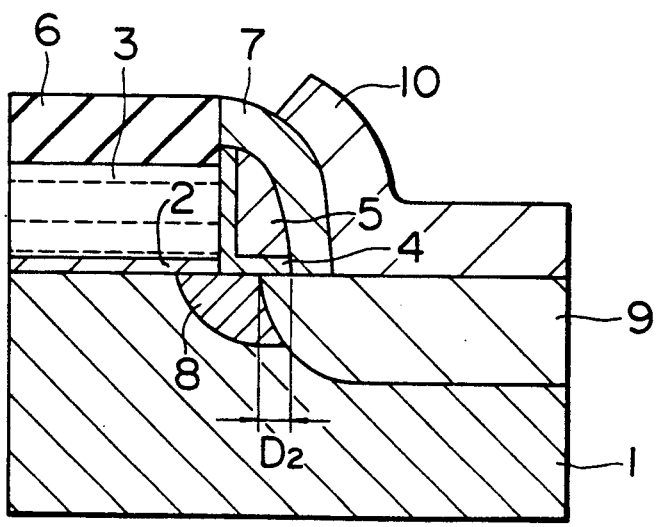

In contrast, when the thickness of the second gate side wall 7 is reduced to some extent as shown in FIG. 7b, it is possible to form the N-type high-density diffusion layer 9 to such a region as to allow one end thereof to underlie the gate side wall 5.

Second Embodiment

FIGS. 3a to 3h are sectional views illustrative of a process for producing a second embodiment of the transistor of the present invention. The process will be explained with reference to these Figures.

Figure 3A:
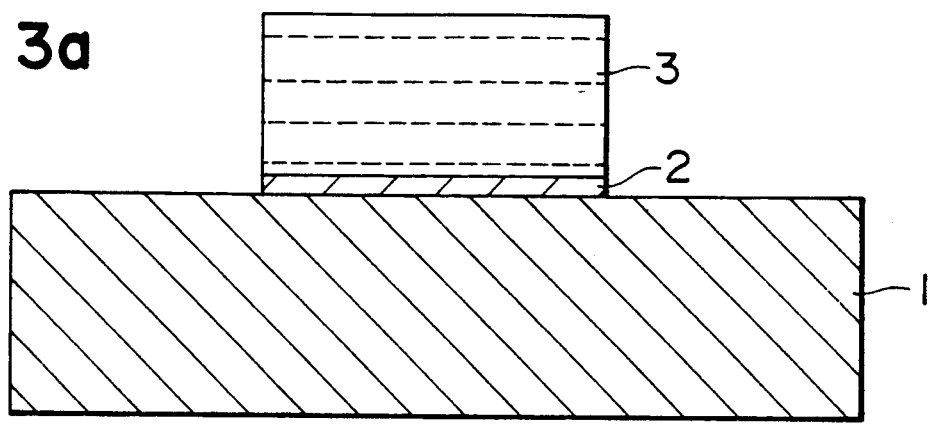
FIGS. 3a to 3h are sectional views illustrating steps in an embodiment of the process for producing a MOS transistor in accordance with the present invention.

In a step shown in FIG. 3a, an $SiO_2$ gate oxide film 2 is formed on the P-type semiconductor substrate 1, and a gate electrode layer, e.g., a polysilicon layer of 300 nm thick, is deposited on the gate oxide film 2. Then, the gate electrode layer is selectively etched by masking, whereby a gate electrode 3 is formed.

Figure 3B:
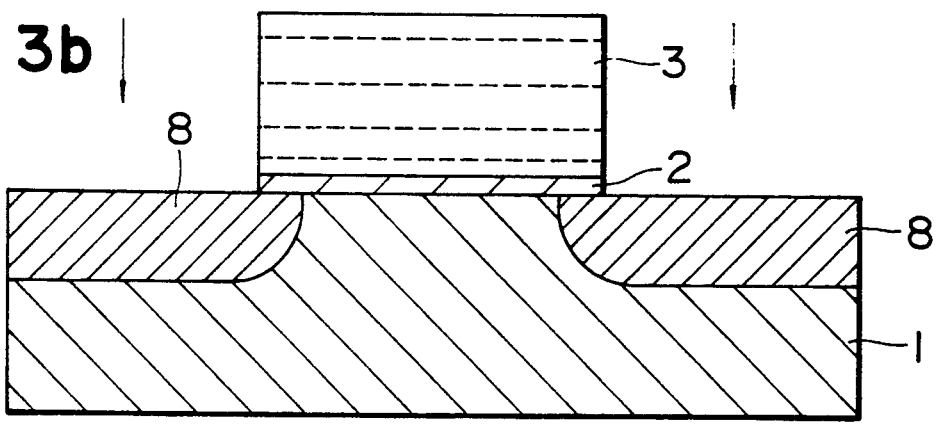

In a step shown in FIG. 3b, an N-type low-density diffusion layer 8 is formed on the surface of the P-type semiconductor substrate 1 which is not covered with the gate electrode 3, by ion injection technique which is conducted with an injection energy of P+ ion of 40 KeV at a rate of $2 \times 10^{13}$ $CM^{-2}$.

Figure 3C:
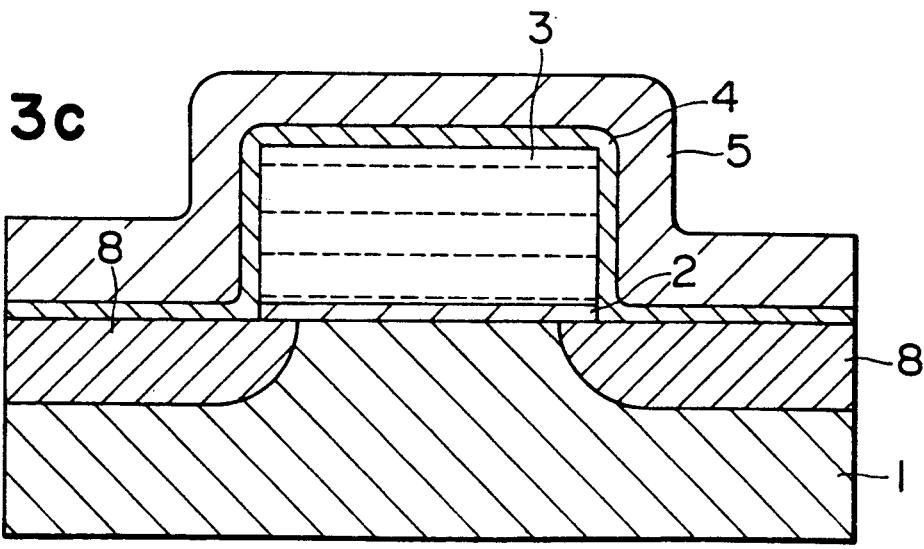

In a step shown in FIG. 3c, a first thin oxide film 4, e.g., an HTO film of 20 nm thick, is deposited on the gate electrode 3 and the N-type low-density diffusion layer 8. Then, a first gate side wall layer 5, e.g., a polysilicon layer of 150 nm, is formed on the first thin oxide film 4.

Figure 3D:
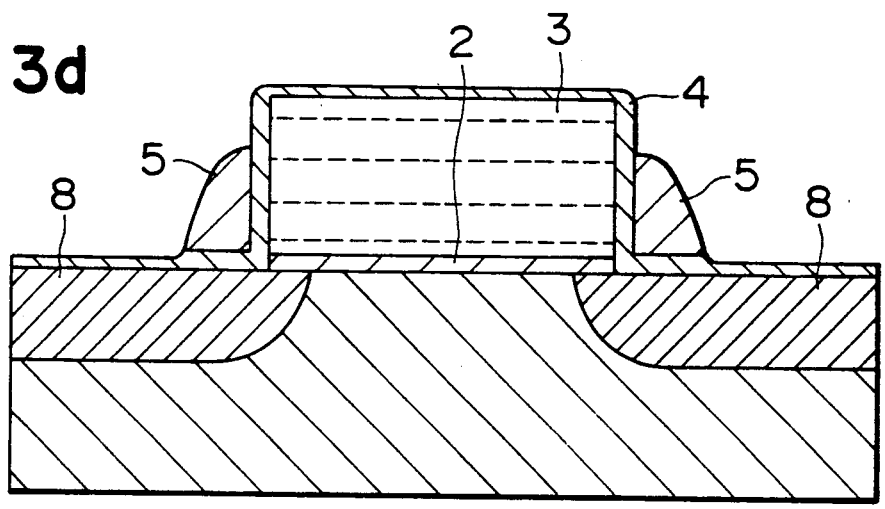

In a step shown in FIG. 3d, an etching process is conducted with a large anisotropy in the vertical direction so as to effect an over-etching, so that the first gate side wall layer 5 is allowed to remain in a self-aligning manner on the side of the gate electrode 3 such that the height of the first gate side wall 5 is not higher than the level of the gate electrode 3. The first thin oxide film 4 is not etched substantially because it has a smaller etch rate than the material of the first gate side wall 5.

Figure 3E:
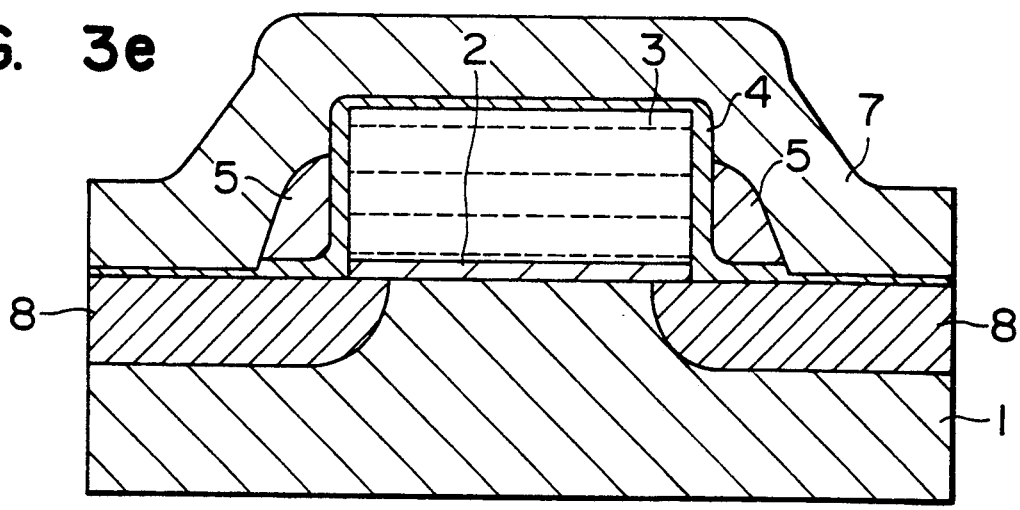

In a step shown in FIG. 3e, a second gate side wall oxide film 7 is deposited to cover the first gate side wall material 5 and the first thin oxide film 4.

Figure 3F:
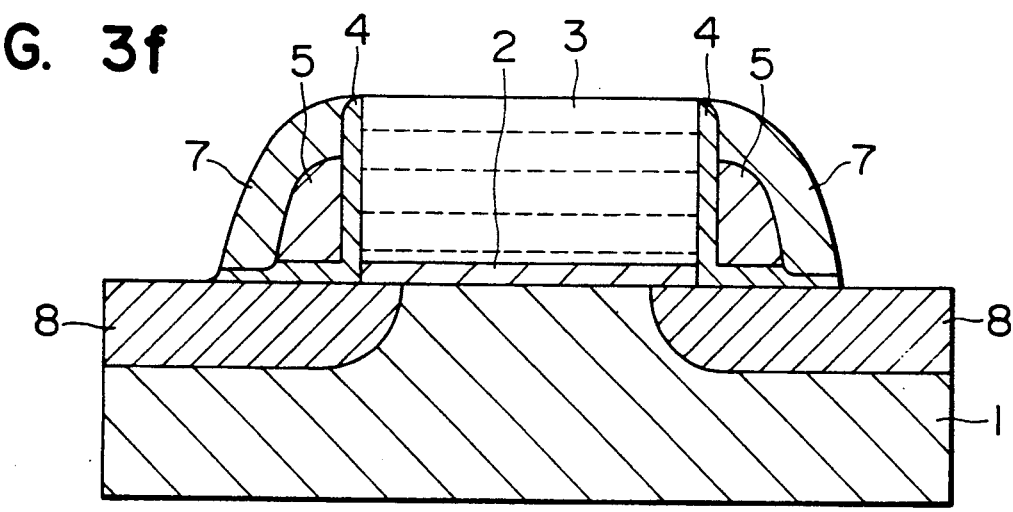

In a step shown in FIG. 3f, an etching process is performed with a large anisotropy in the vertical direction so that the second gate side wall oxide film 7, e.g., an HTO film of 150 nm thick, is etched to remain on and cover the side surface of the gate electrode 3 and the first gate side wall 5.

Figure 3G:
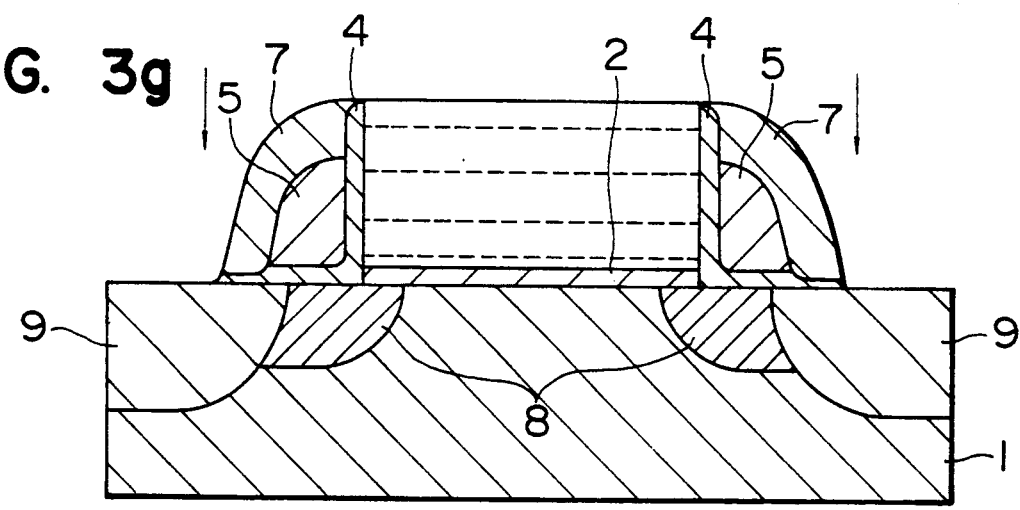

In a step shown in FIG. 3g, an N-type high-density diffusion layer 9 is formed by ion injection on the surface of the P-type semiconductor substrate 1 which is not covered with the gate electrode 3 and the second gate side wall oxide film 7.

Figure 3H:
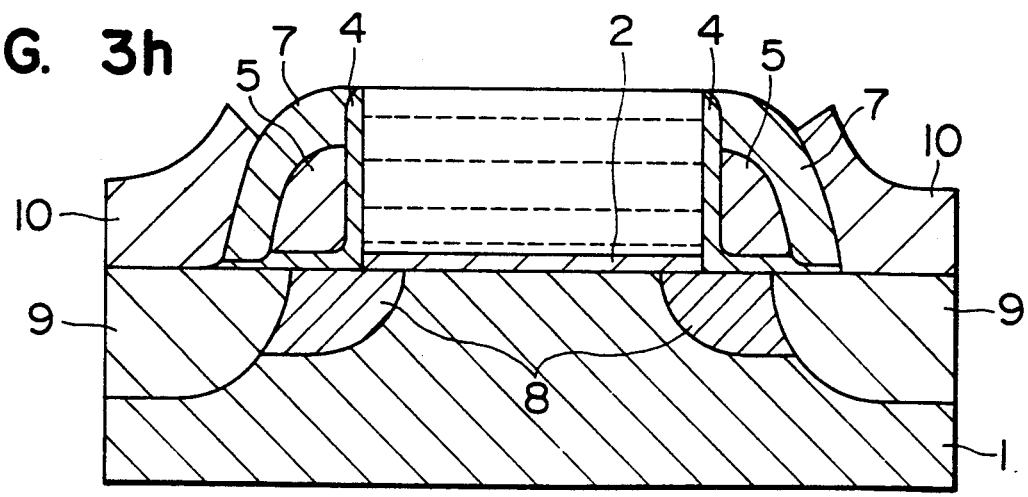

In a step shown in FIG. 3h which follows the step shown in FIG. 3g, an Al film is deposited by a thickness of 500 nm in self-alignment with the N-type high-density diffusion layer 9, and is then followed by an ordinary photo-etching process for removing the portion of the Al film on the gate electrode, whereby the N-type high-density diffusion layer 9 and the wiring 10 are connected in a self-aligning manner.

It is thus possible to easily obtain a semiconductor device by known LSI technique with good self-alignment and without increasing the number of steps of the process.

Third Embodiment

FIGS. 4a to 4g are sectional views illustrating successive steps of a process for producing a semiconductor device in accordance with a third embodiment of the present invention. The process will be explained hereinunder with reference to these figures.

Basically, the process is the same as that shown in FIGS. 3a to 3d in the second embodiment. In the step shown in FIG. 4a which follows the step shown in FIG. 3d of the second embodiment, an N-type high-density diffusion layer 9 is formed by ion injection on the portion of the P-type semiconductor substrate 1 which is not covered with by gate electrode 3 and the first gate side wall 5. An N-type high-density first gate side wall 11 is formed simultaneously with the N-type high-density diffusion layer 9.

Figure 4A:
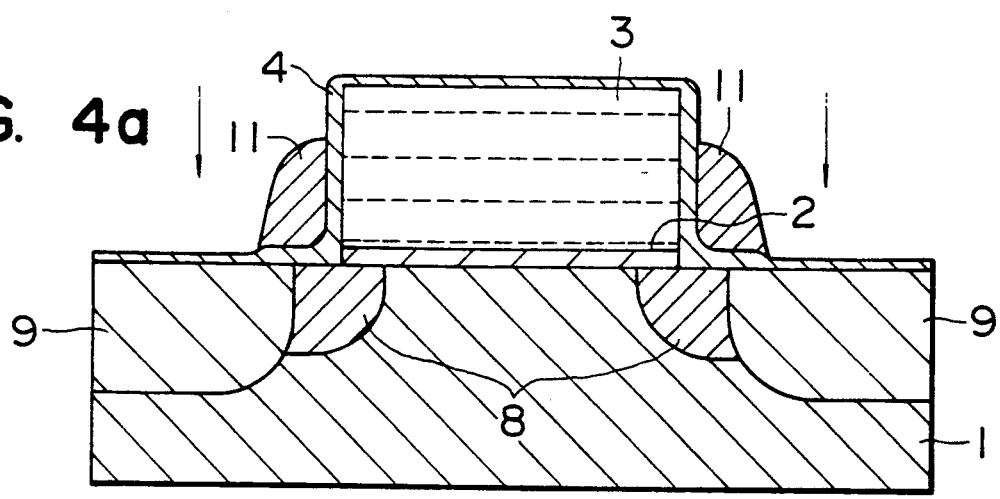
FIGS. 4a to 4c are sectional views showing steps in another embodiment of the process for producing a MOS transistor in accordance with the present invention.
Figure 4B:
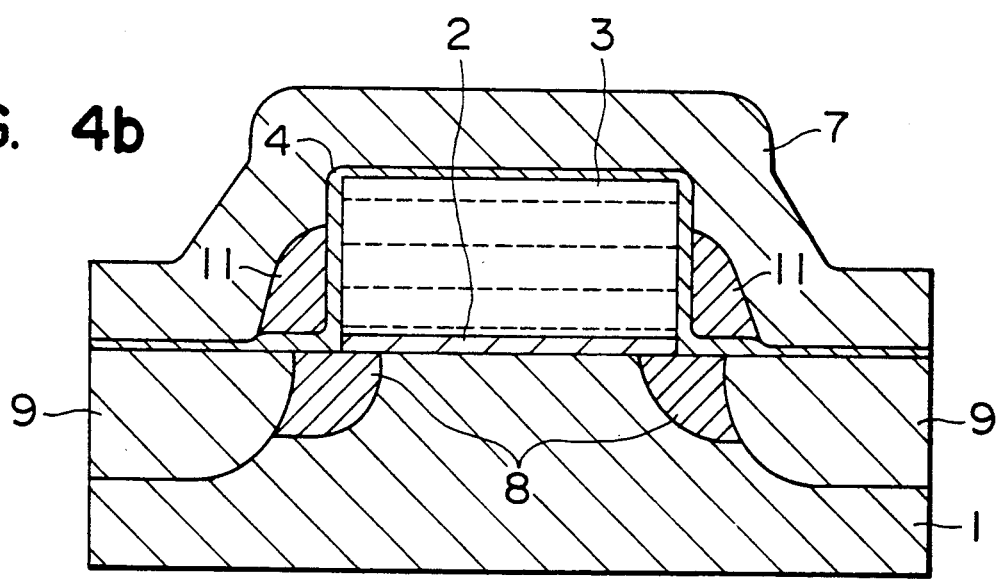

In a step shown in FIG. 4b, a second gate side wall oxide film 7, e.g., an HTO film of 150 nm, is deposited on the high-density N-type first gate side wall 11 and the first thin oxide film 4.

Figure 4C:
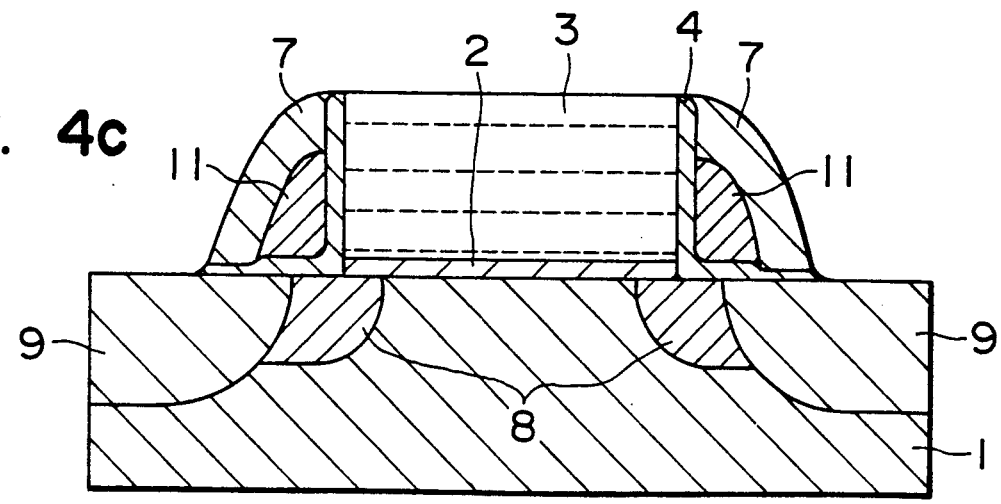

In a step shown in FIG. 4c, an etching is effected with a large vertical anisotropy so that the second gate side wall oxide film 7 is partly etched to remain only on the side surface of the gate electrode 3 and on the N-type high-density side wall 11.

It is thus possible to easily obtain a semiconductor device by known LSI technique with good self-alignment and without increasing the number of steps of the process.

In the first to third embodiments as described, polysilicon is used as the material of the first gate side wall 5. This, however, is only illustrative and it will be obvious to those skilled in the art that other materials of a high dielectric constant, e.g., deposited $Si_3N_4$ or $Ta_2O_5$, can be used similarly to the material of the first gate side wall 5.

It will be also clear that the semiconductor devices of the first to third embodiments as described can be realized as MIS transistors which use, in place of the gate oxide film 2, a nitrogen oxide insulating film, an $SiO_2$/SiN film or an $SiO_2$/SiN/$SiO_2$ film.

The advantages of the invention described hereinbefore can be obtained not only with N-channel devices as described but also on P-channel devices.

The second embodiment as described may be modified such that, after the deposition of the gate electrode 3, e.g., a polysilicon film of 250 nm, a third insulation film, e.g., an HTO film of 150 nm, is deposited, and is followed by a selective etching process through masking so as to form a gate wiring having the third insulation film 6 and the gate electrode 3 which are stacked one upon another.

It will be also clear that the first thin oxide film 4, which is formed by deposition on the N-type low-density diffusion layer 8 in the step shown in FIG. 3c, may be formed by an oxidation technique.

As will be understood from the foregoing description, the present invention offers various industrial advantages. Firstly, it is to be noted that the electric field of high intensity around the drain is reduced by virtue of the first gate side wall layer which has a high dielectric constant, whereby hot-electron degradation can be suppressed. Secondly, the gate electrode and the high-density diffusion layer are separated from each other by the second gate side wall layer which is composed of an insulating film, so as to make it possible to attain electrical contact in a self-aligning manner. Thirdly, the parasitic capacitance between the gate electrode and the wiring above the gate electrode can be reduced.

What is claimed is:

1. A method of producing a MIS transistor, comprising the steps of:
    (a) forming a gate insulation film on a major surface of a semiconductor substrate of a first conduction type;
    (b) forming a gate electrode on said gate insulation film;
    (c) performing ion-implantation on said substrate by using said gate electrode as a mask for forming a source and drain low density diffusion layer of a second conduction type on said substrate;
    (d) depositing a first insulating film which covers said gate electrode and said semiconductor substrate;
    (e) depositing a dielectric film on said first insulating film, said dielectric film having a dielectric constant that is higher than that of said first insulating film;
    (f) effecting an etching process with a large anisotropy vertical to said substrate, to said dielectric film so as to allow said dielectric film to remain along said first insulation film at portions thereof adjacent side surfaces of said gate electrode and disposed above said substrate, said dielectric film having a height that is lower than that of said gate electrode and making contact with said first insulation film adjacent said side surfaces of said gate electrode;
    (g) depositing a second insulating film all over a major surface of said substrate;
    (h) effecting an etching process on said second insulating film so as to allow said second insulating film to continue to cover said dielectric film and to make contact with said first insulating film adjacent said side surfaces of said gate electrode;
    (i) performing ion-implantation on said substrate while using said second insulating film and said gate electrode as a mask for forming a source and drain high density diffusion layer of said second conduction type that is joined to said low density diffusion layer; and
    (j) forming a source and drain electrode on said source and drain high density diffusion layer of said second conduction type.

2. A method of producing a MIS transistor as in claim 1, wherein step (i) is performed after said dielectric film is formed in step (e) on said first insulating film adjacent said side surfaces of said gate electrode.

3. A method of forming a MIS transistor as in claim 1, wherein said second insulating film has a dielectric constant which is lower than that of said dielectric film.

* * * * *